(12) United States Patent
Ozawa et al.

(10) Patent No.: US 8,299,571 B2
(45) Date of Patent: Oct. 30, 2012

(54) RESISTANCE-CHANGE MEMORY CELL ARRAY

(75) Inventors: Yoshio Ozawa, Yokohama (JP); Katsuyuki Sekine, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 12/941,434

(22) Filed: Nov. 8, 2010

(65) Prior Publication Data
US 2011/0140068 A1 Jun. 16, 2011

(30) Foreign Application Priority Data
Dec. 16, 2009 (JP) .................. 2009-285421

(51) Int. Cl.
*H01L 47/00* (2006.01)
(52) U.S. Cl. .................. 257/530; 257/E29.325; 257/4
(58) Field of Classification Search .................. 257/530, 257/4, E29.325
See application file for complete search history.

(56) References Cited

U.S. PATENT DOCUMENTS

| 8,124,968 B2* | 2/2012 | Koo et al. ................ 257/42 |
| 2008/0175032 A1 | 7/2008 | Tanaka et al. | |
| 2009/0251963 A1* | 10/2009 | Seol et al. ............... 365/185.05 |
| 2010/0072452 A1* | 3/2010 | Kim et al. ........................ 257/4 |
| 2011/0115049 A1* | 5/2011 | Kim et al. .................... 257/530 |

FOREIGN PATENT DOCUMENTS
JP 2008-181978 8/2008

OTHER PUBLICATIONS

Hong Sik Yoon, et al., "Vertical Cross-point Resistance Change Memory for Ultra-High Density Non-volatile Memory Applications", 2009 Symposium on VLSI Technology Digest of Technical Papers, 2B-2, pp. 26-27.

* cited by examiner

*Primary Examiner* — Marcos D. Pizarro
*Assistant Examiner* — Eva Yan Montalvo
(74) *Attorney, Agent, or Firm* — Oblon, Spivak, McClelland, Maier & Neustadt, L.L.P.

(57) ABSTRACT

According to one embodiment, a resistance-change memory cell array in which a plurality of horizontal electrodes extending horizontally and a plurality of vertical electrodes extending vertically are arranged to configure a cross-point structure includes rectifying insulating films formed in contact with side surfaces of the vertical electrodes in facing regions between the horizontal electrodes and the vertical electrodes, variable resistance films formed in contact with side surfaces of the horizontal electrodes in the facing regions between the horizontal electrodes and the vertical electrodes, and conductive layers formed between the rectifying insulating films and the variable resistance films.

20 Claims, 17 Drawing Sheets

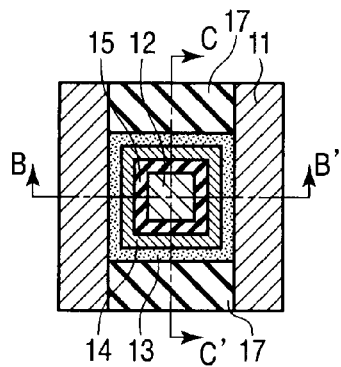
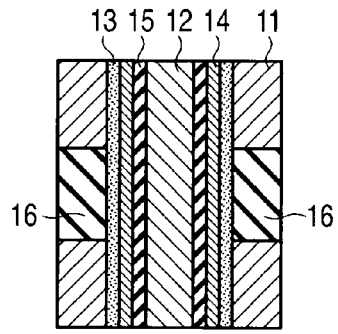
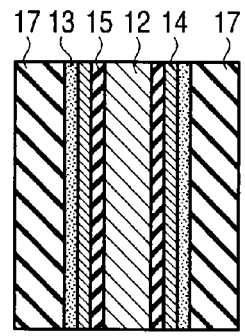
F I G. 2A   F I G. 2B   F I G. 2C
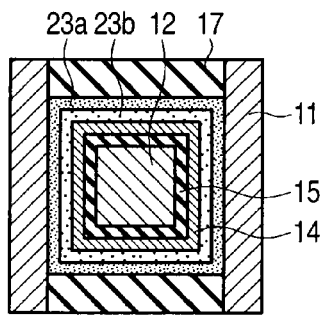
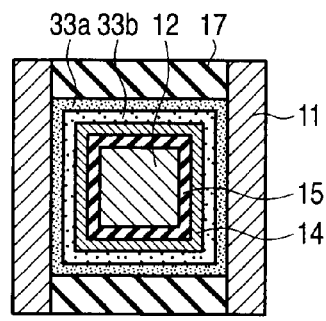
F I G. 3A   F I G. 3B
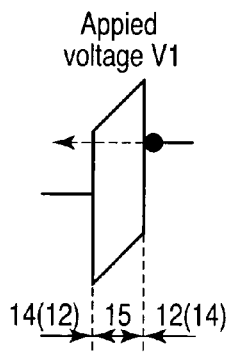
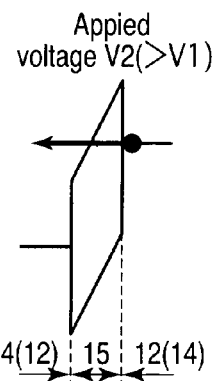
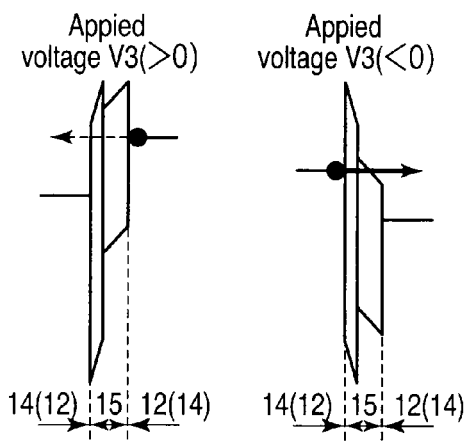
F I G. 4A   F I G. 4B   F I G. 4C   F I G. 4D

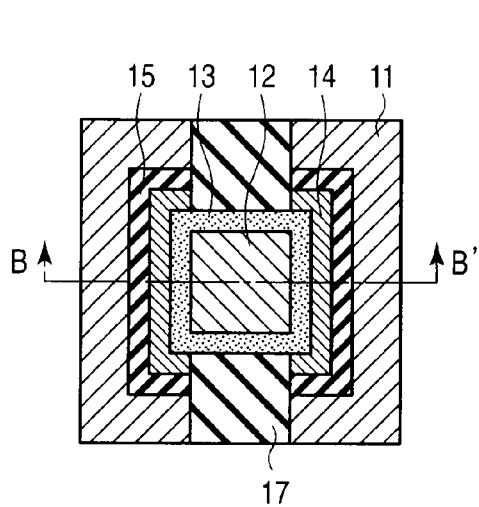
F I G. 13A
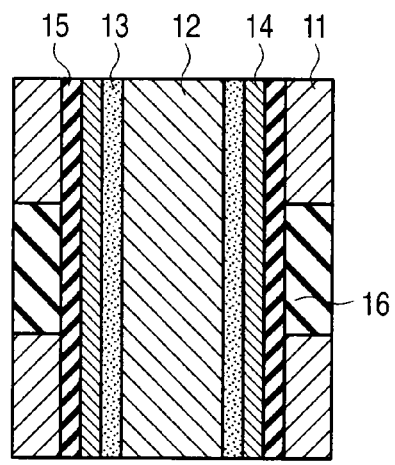
F I G. 13B
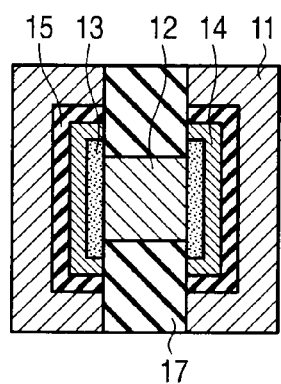
F I G. 14A
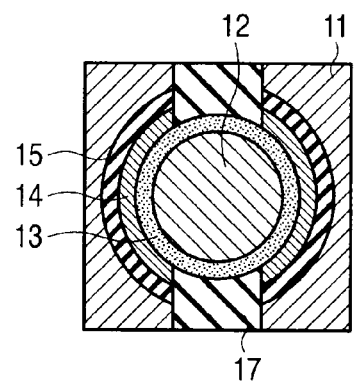
F I G. 14B
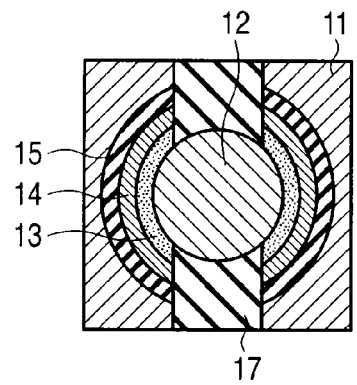
F I G. 14C

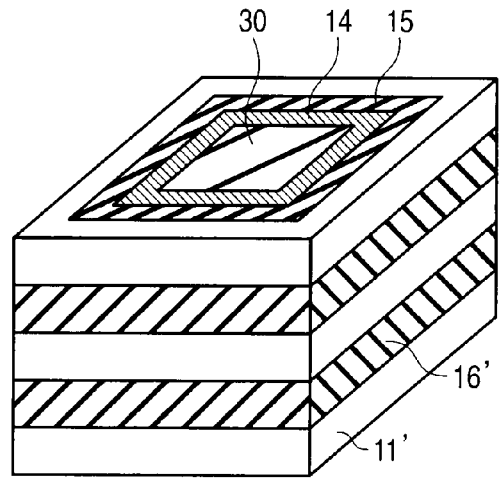
F I G. 16A
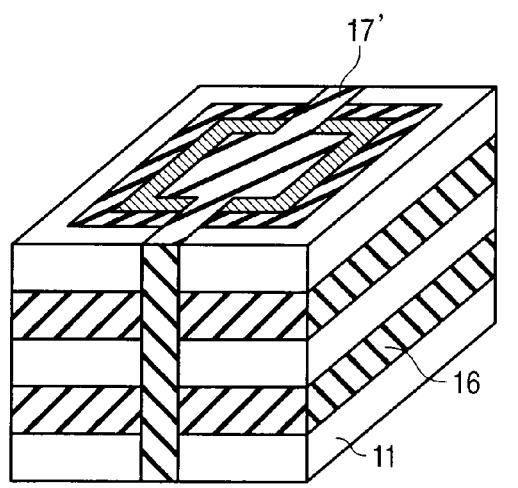
F I G. 16B
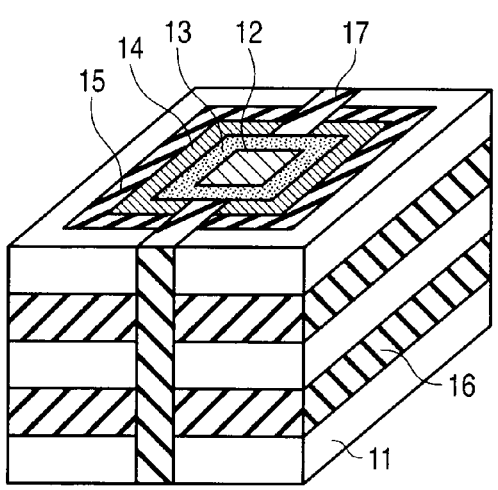
F I G. 16C

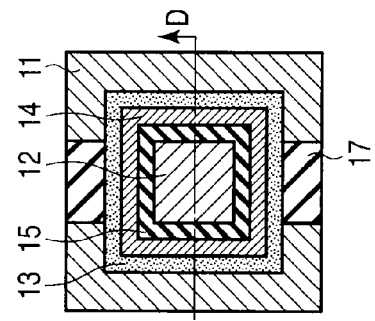
FIG. 18A
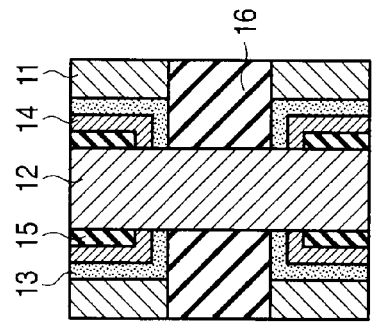
FIG. 19A
FIG. 18B
FIG. 19B
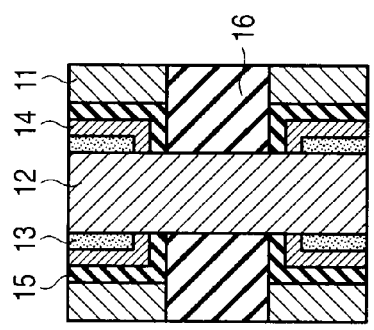
FIG. 18C
FIG. 19C
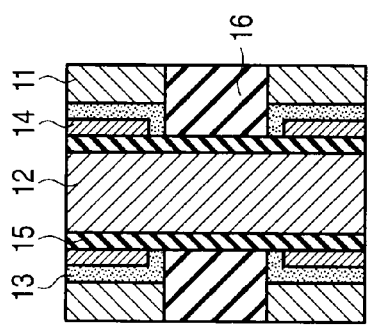
FIG. 18D
FIG. 19D
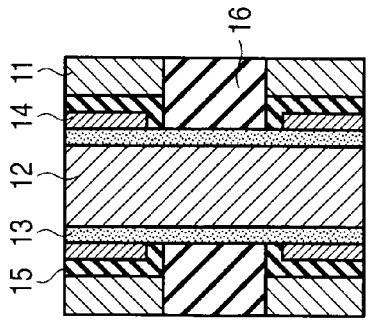

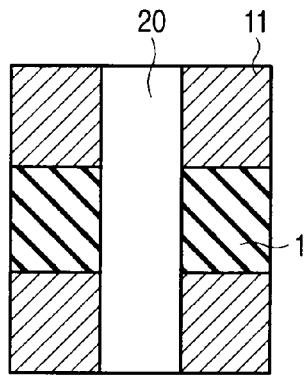
F I G. 21A
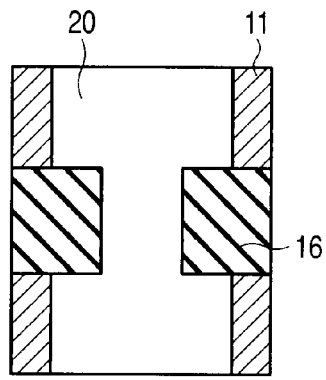
F I G. 21B
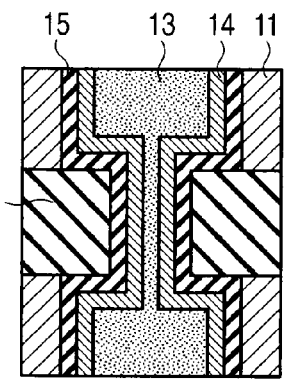
F I G. 21C
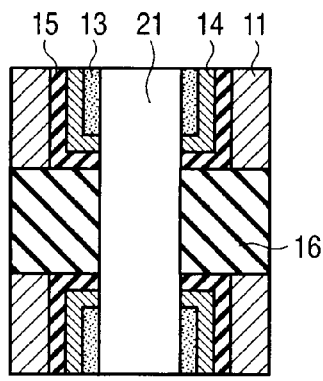
F I G. 21D
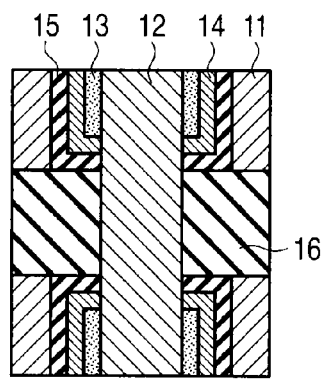
F I G. 21E

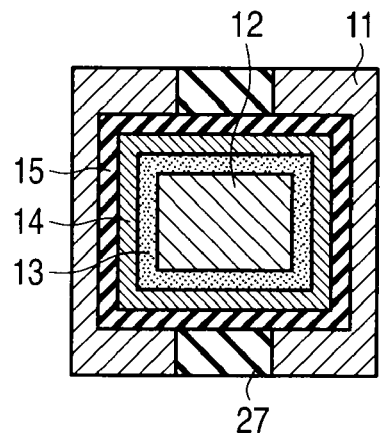 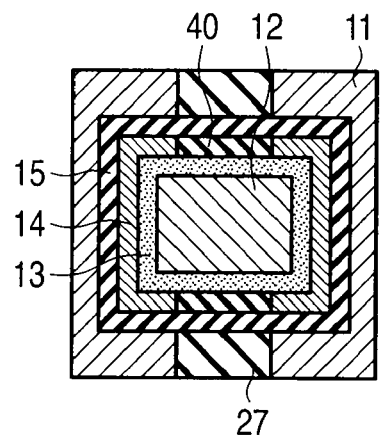
F I G. 22A  F I G. 22B
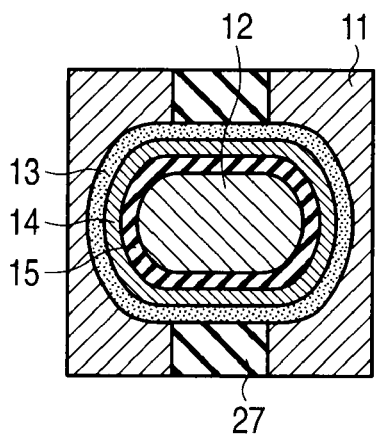 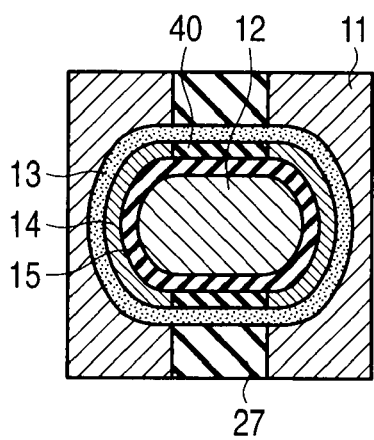
F I G. 23A  F I G. 23B

RESISTANCE-CHANGE MEMORY CELL ARRAY

CROSS-REFERENCE TO RELATED APPLICATIONS

This application is based upon and claims the benefit of priority from Japanese Patent Application No. 2009-285421, filed Dec. 16, 2009; the entire contents of which are incorporated herein by reference.

FIELD

Embodiments described herein relate generally to a resistance-change memory cell array of a cross-point structure.

BACKGROUND

Recently, as one of 3-dimensional resistance-change memory cell arrays, a cell array structure that can avoid degradation in the film quality in the manufacturing process and reduce the manufacturing cost is proposed (for example, see Jpn. Pat. Appln. KOKAI Publication No. 2008-181978 and 2009, Symposium on VLSI Technology Digest of Technical Papers, pp. 26-27). With the above cell array structure, a plurality of horizontal electrodes extending horizontally and a plurality of vertical electrodes extending vertically are arranged to configure a cross-point structure. Then, resistance-change films are sandwiched between the horizontal electrodes and the vertical electrodes to configure a cell array structure.

However, with this type of cell array structure, the following problem occurs. That is, with the resistance-change memory cell array, there occurs a case where it is desired to preferentially reduce a leakage current that flows in an unselected cell and a case where it is desired to preferentially supply a sufficiently large current to a selected cell according to the scale and application of the array. However, it is difficult to optimize the above requirements according to the characteristics required for the array. Specifically, in the large-scale array, a leakage current flowing in an unselected cell at the data read time or data write/erase time cannot be neglected, and therefore, there occurs a problem that the power consumption becomes larger as the integration density is more enhanced. Further, in the array that is required to have a high-speed response characteristic, there occurs a problem that a switching yield is lowered if a sufficiently large current cannot be supplied to a selected cell.

BRIEF DESCRIPTION OF THE DRAWINGS

FIGS. 2A, 2B and 2C are cross-sectional views showing the structure of a 2-cell portion of the resistance-change memory cell array according to the first embodiment.

FIGS. 3A and 3B are cross-sectional views showing modifications of the resistance-change memory cell array of the first embodiment.

FIGS. 4A, 4B, 4C and 4D are energy band diagrams for illustrating the action of a rectifying insulating film.

FIGS. 13A and 13B are cross-sectional views showing the structure of a 2-cell portion of a resistance-change memory cell array according to a third embodiment.

FIGS. 14A, 14B and 14C are cross-sectional views showing modifications of the resistance-change memory cell array of the third embodiment.

FIGS. 16A, 16B and 16C are bird's-eye views showing a manufacturing process of the resistance-change memory cell array of the third embodiment.

FIGS. 18A, 18B, 18C and 18D are cross-sectional views showing the horizontal structure of a 2-cell portion of a resistance-change memory cell array according to a fourth embodiment.

FIGS. 19A, 19B, 19C and 19D are cross-sectional views showing the vertical structure of the 2-cell portion of the resistance-change memory cell array according to the fourth embodiment.

FIGS. 21A, 21B, 21C, 21D and 21E are cross-sectional views showing a modification of the manufacturing process of the resistance-change memory cell array of the fourth embodiment.

FIGS. 22A and 22B are cross-sectional views showing a manufacturing process (horizontal division) of a resistance-change memory cell array according to a fifth embodiment.

FIGS. 23A and 23B are cross-sectional views showing another manufacturing process (horizontal division) of the resistance-change memory cell array of the fifth embodiment.

DETAILED DESCRIPTION

In general, according to one embodiment, a resistance-change memory cell array in which a plurality of horizontal electrodes extending horizontally and a plurality of vertical electrodes extending vertically are arranged to configure a cross-point structure includes rectifying insulating films formed in contact with side surfaces of the vertical electrodes in facing regions between the horizontal electrodes and the vertical electrodes, variable resistance films formed in contact with side surfaces of the horizontal electrodes in the facing regions between the horizontal electrodes and the vertical electrodes, and conductive layers formed between the rectifying insulating films and the variable resistance films.

Next, the embodiments will be explained below with reference to the accompanying drawing.

First Embodiment

Figure 1A:
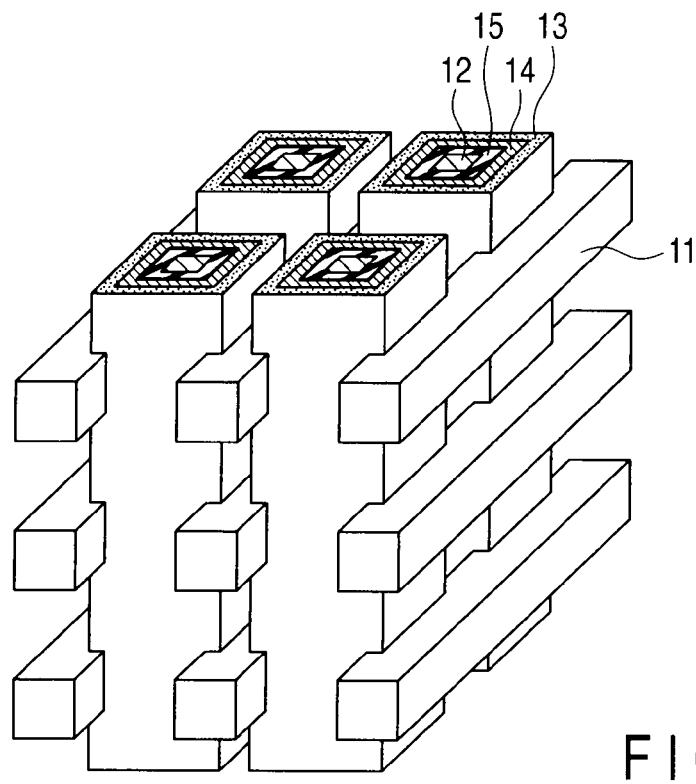
FIGS. 1A and 1B are bird's-eye views each showing the structure of a resistance-change memory cell array according to a first embodiment.
Figure 1B:
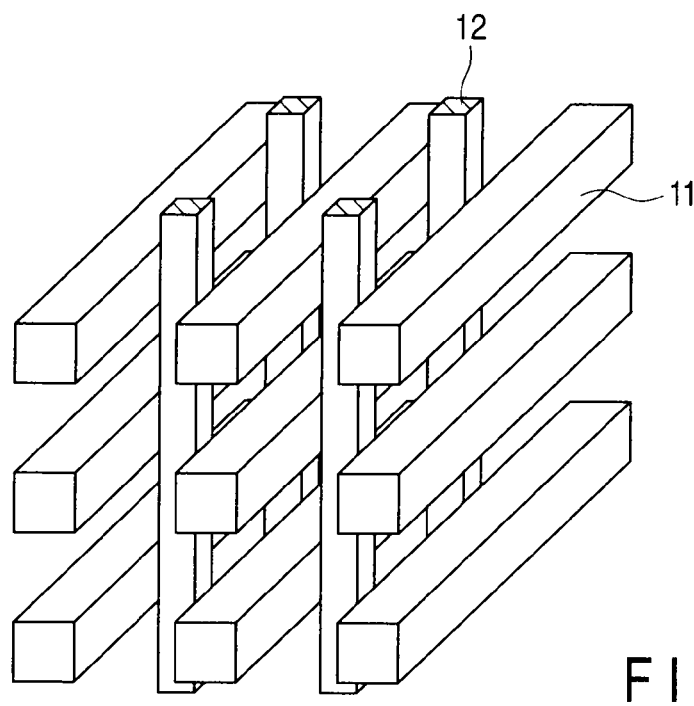

FIGS. 1A, 1B and FIGS. 2A to 2C are views showing the structure of a resistance-change memory cell array according to a first embodiment. FIG. 1A is a bird's-eye view showing the whole structure except interelectrode insulating films, FIG. 1B is a bird's-eye view showing only electrode portions and FIGS. 2A to 2C are cross-sectional views showing the structure of one memory cell portion.

As shown in FIGS. 1A and 1B, a plurality of horizontal electrodes 11 extending horizontally and a plurality of vertical electrodes 12 extending vertically are arranged to configure a 3-dimensional cross-point structure. Further, a rectifying insulating film 15, conductive layer 14 and variable resistance film 13 are sequentially formed from the inside portion on the side surface portion of each vertical electrode 12. That is, as shown in FIGS. 2A to 2C, in a facing region between the electrodes 11 and 12, the rectifying insulating film 15, conductive layer 14 and variable resistance film 13 are sandwiched between the side surface of the horizontal electrode 11 and the side surface of the vertical electrode 12. The aria of the rectifying insulating film 15 in a direction perpendicular to the facing direction of the electrodes 11 and 12 is smaller than the aria of the variable resistance film 13 in a direction perpendicular to the facing direction of the electrodes 11 and 12. Interelectrode insulating films 16, 17 are respectively formed in regions between the horizontal electrodes and regions between the vertical electrodes. FIG. 2A is a cross-sectional view in the horizontal direction, FIG. 2B is a cross-sectional view taken along line B-B' of FIG. 2A and FIG. 2C is a cross-sectional view taken along line C-C' of FIG. 2A.

In this case, materials of the horizontal electrode 11 and vertical electrode 12 are more suitable for high integration if they have a high melting point and low resistance. For example, it is desirable to use tungsten, tantalum, ruthenium, tungsten silicide, titanium silicide, nickel silicide, cobalt silicide and the like.

The variable resistance film 13 is formed of a material whose resistance can be reversibly changed according to application of a voltage and may be formed of a unipolar type switching material whose resistance can be changed according to application of a unipolar voltage or a bipolar type switching material whose resistance can be changed according to application of a bipolar voltage. Specifically, a filament-forming material such as nickel oxide, titania or hafnia may be used or a phase-change material such as Chalcogenide materials or a carbon film may be used.

Further, as the variable resistance film 13, an oxygen ion mobile material can be used. For example, as shown in FIG. 3A, the variable resistance film 13 may be formed with a laminated structure of an electrolyte tunnel insulating film 23$a$ and oxygen ion supply layer 23$b$. As a material of the electrolyte tunnel insulating film 23$a$, alumina, hafnia, zirconia or a material having yttrium, calcium or magnesium added to the above insulating material can be used. As a material of the oxygen ion supply layer 23$b$, perovskite oxide such as strontium ruthenium oxide or praseodymium calcium manganese oxide can be used.

Further, as the variable resistance film 13, a metal ion mobile material can be used. For example, as shown in FIG. 3B, the variable resistance film 13 may be formed with a laminated structure of a metal ion supply layer 33$a$ and a solid electrolyte layer 33$b$. As a material of the metal ion supply layer 33$a$, copper, silver, titanium or the like can be used. Further, as a material of the solid electrolyte layer 33$b$, tantalum oxide, silicon or the like can be used.

Among the above materials of the variable resistance film, the "filament-forming material", "oxygen ion mobile material" and "metal ion mobile material" are preferable in that the operation can be performed at a low switching voltage.

As a material of the conductive layer 14, any conductive material can be used and metal, silicide, oxide, nitride and silicon having a dopant element added thereto can be used.

The rectifying insulating film 15 is an insulating material that controls a passage current amount according to the magnitude and polarity of an application voltage. For example, if an insulating film such as a silicon oxide film or alumina is used, the passage current amount can be changed by several digits by changing the magnitude of the application voltage by several times (see the energy band diagrams of FIGS. 4A and 4B). The rectifying action can be attained based on the so-called tunnel effect. Therefore, if a material is selected to increase a difference between the work functions of the rectifying insulating material and the electrode material, a more significant rectifying effect can be attained.

Further, the rectifying insulating film 15 can be formed with a multi-layered structure of different materials. For example, if a two-layered structure of a silicon oxide film and alumina is used, the passage current amount can be changed by several digits according to the polarity of the application voltage (see the energy band diagrams of FIGS. 4C and 4D). The rectifying action can also be attained based on the so-called tunnel effect. Particularly, a more significant rectifying effect can be attained by laminating insulating film materials having a large difference in the dielectric constant.

As materials of the interelectrode insulating films 16, 17, any material having an insulation property can be used and, for example, a silicon oxide film or silicon nitride film can be used.

Thus, according to the present embodiment, since the area of the rectifying insulating film 15 is smaller than the area of the variable resistance film 13 in the facing region between the electrodes 11 and 12, an electric field applied to the rectifying insulating film 15 can be increased when a voltage is applied between the electrodes 11 and 12. Therefore, a sufficiently large current can be supplied to the variable resistance film of a selected cell and a switching yield can be enhanced. The effects become more significant when a large current is required for the switching operation as in a case where a phase-change switching material is used, for example.

Further, since an electric field applied to the variable resistance film 13 is reduced, so-called "read disturb failure" in which a data is rewritten by the resistance changing at the data read operation time can be easily avoided. Particularly, the effect becomes more significant when the variable resistance film is formed of a "filament-forming material", "oxygen ion mobile material" or "metal ion mobile material" that performs the switching operation at the low voltage.

Figure 5A:
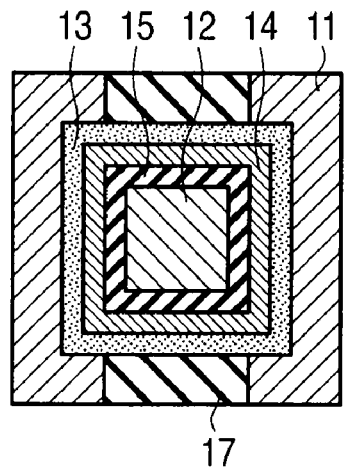
FIGS. 5A and 5B are cross-sectional views showing modifications of the resistance-change memory cell array of the first embodiment.
Figure 5B:
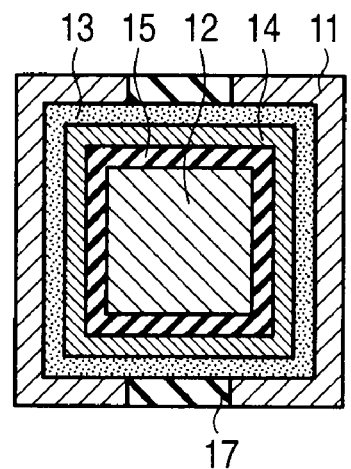

In FIG. 2A, a case wherein the width of the horizontal electrode 11 is constant is shown, but the present embodiment is not limited to this case. For example, as shown in FIG. 5A, the width of the horizontal electrode 11 may be made narrower in the facing region between the electrodes 11 and 12 and the width of the vertical electrode 12 may be made larger than the distance between the horizontal electrodes 11 as shown in FIG. 5B. Specifically, a concave portion that contains an area facing the vertical electrode 12 and is larger than the area is formed in one side surface of the horizontal electrode 11 that faces the vertical electrode 11. Then, the variable resistance film 13, conductive layer 14 and rectifying insulating film 15 are provided between the concave portion and the vertical electrode 12. With this structure, the cross-sectional area of the vertical electrode 12 is enlarged to reduce the electrode resistance. Therefore, variation in the application voltage to the memory cell can be suppressed and the memory erroneous operation can be avoided even if the integration density is increased. Further, since the variable resistance film 13 and rectifying insulating film 15 can be formed with preset film thickness even when the cell dimensions are miniaturized, an advantage that shorting failure can be avoided is attained.

If the horizontal electrode 11 is formed with a cross-sectional structure having rectangular grooves formed therein as shown in FIGS. 5A and 5B, the following effects can be attained.

(1) An increase in the local electric field in each corner portion of the vertical electrode 12 becomes significant, a low-resistance path can be easily formed in the corner portion and the operation speed of the switching operation can be increased.

(2) Local electric fields in a plurality of corner portions (two portions in the case of FIGS. 5A and 5B) are increased and a plurality of low-resistance paths can be formed. As a result, a multi-level cell operation can be performed and the high integration of the memory can be realized.

(3) Since a total amount of currents that are passed through the vertical electrode 12 can be made small, variation in the application voltage of the memory cell can be suppressed even if the cross section of the vertical electrode 12 is made narrow. Therefore, this structure becomes suitable for high integration of the memory.

Figure 6A:
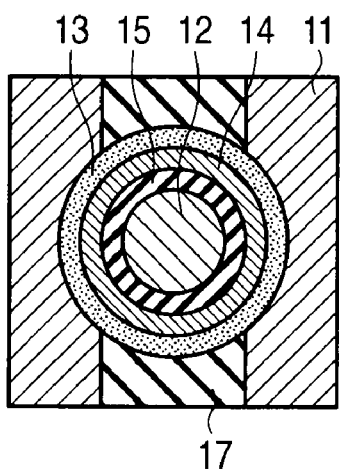
FIGS. 6A and 6B are cross-sectional views showing modifications of the resistance-change memory cell array of the first embodiment.
Figure 6B:
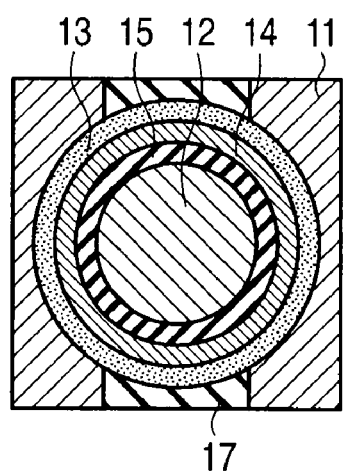

The cross-sectional shape of the vertical electrode 12 is not necessarily limited to the shapes shown in FIG. 2A and FIGS. 5A and 5B. For example, as shown in FIGS. 6A and 6B, the side surface of the vertical electrode 12 can be formed in a convex curved form and the side surface of the horizontal electrode 11 can be formed in a concave curved form in the facing region between the electrodes 11 and 12. For example, the vertical electrode 12 can be formed in a column form and circular arc grooves may be formed in portions of the horizontal electrode 11 that face the vertical electrode 12. As a result, when a voltage is applied between the electrodes 11 and 12, a difference between an electric field applied to the variable resistance film 13 and an electric field applied to the rectifying insulating film 15 becomes large and the effect (a reduction in the switching operation voltage and a reduction in the power consumption) of the present embodiment becomes more significant.

Next, a manufacturing method of the memory cell array of the present embodiment is explained with reference to FIGS. 7A to 7D.

Figure 7A:
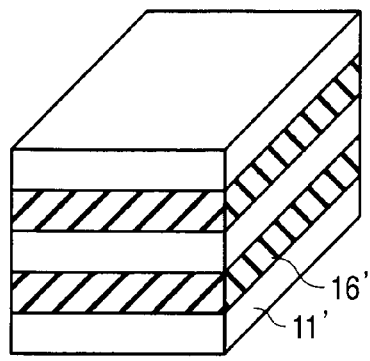
FIGS. 7A, 7B, 7C and 7D are bird's-eye views showing a manufacturing process of the resistance-change memory cell array of the first embodiment.

First, as shown in FIG. 7A, conductive layers 11' formed of tungsten silicide or the like with a thickness of approximately 30 nm and insulating films 16' formed of silicon oxide films or the like with a thickness of approximately 30 nm are laminated in a multi-layered form on a substrate (not shown) having preset peripheral circuits formed thereon by use of the deposition technique such as a chemical vapor deposition (CVD) method.

Figure 7B:
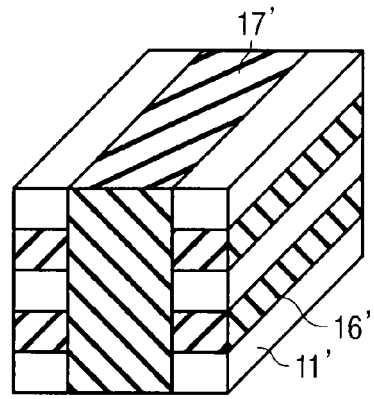

Next, as shown in FIG. 7B, a groove with a width of approximately 30 nm that divides the multi-layered structure is formed by use of an anisotropic etching technique such as a reactive ion etching (RIE) method and then an insulating film 17' formed of a silicon oxide film is filled in the groove by use of a coating method or the like. Thus, horizontal electrodes 11 and interelectrode insulating films 16 are formed.

Figure 7C:
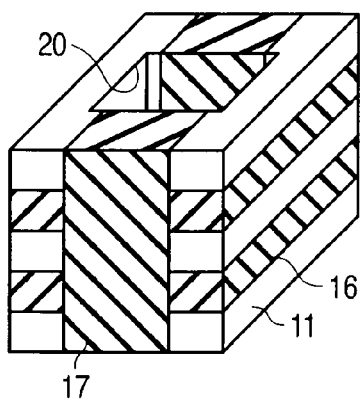

Then, as shown in FIG. 7C, a hole 20 having a rectangular cross-sectional shape in which the length of one side is approximately 40 nm is formed vertically in the area of the insulating film 17' by use of the RIE method or the like. As a result, interelectrode insulating films 17 are formed. At this time, the side surfaces of the horizontal electrodes 11 are slightly shaved off to form concave portions as shown in FIGS. 5A and 5B.

Figure 7D:
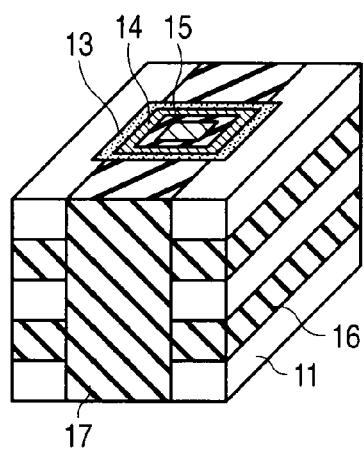

Next, as shown in FIG. 7D, a variable resistance film 13 formed of nickel oxide or the like with a thickness of approximately 5 nm, a conductive layer 14 formed of titanium nitride or the like with a thickness of approximately 5 nm and a rectifying insulating film 15 formed of alumina or the like with a thickness of approximately 5 nm are sequentially formed on the inner wall of the hole 20 by use of a film formation technique such as an atomic layer deposition (ALD) method, CVD method or plating method. As a result, a cavity having a rectangular cross-sectional shape in which the length of one side is approximately 10 nm is formed in the central portion of the hole 20. Then, a vertical electrode 12 formed of a conductor of tungsten is filled in the cavity by use of the CVD method or the like to complete a memory cell array.

Figure 8A:
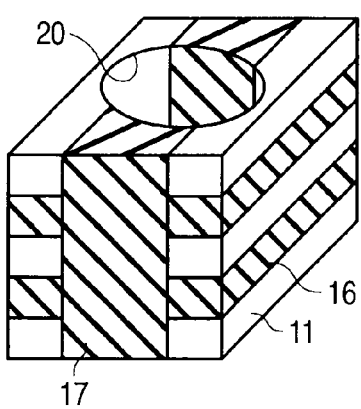
FIGS. 8A and 8B are bird's-eye views showing a modification of the manufacturing process of the resistance-change memory cell array of the first embodiment.
Figure 8B:
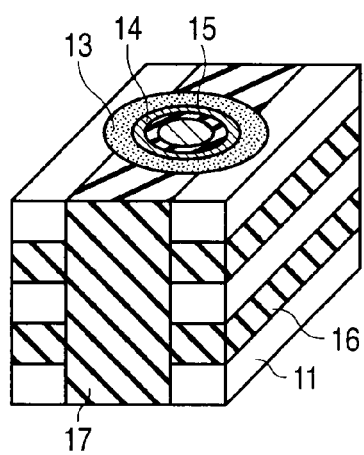

The above manufacturing method is applied to a case where the cross-sectional shape of the hole 20 is rectangular, but is similarly applied to a case where the cross-sectional shape of the hole 20 is circular as shown in FIGS. 8A and 8B.

Figure 9A:
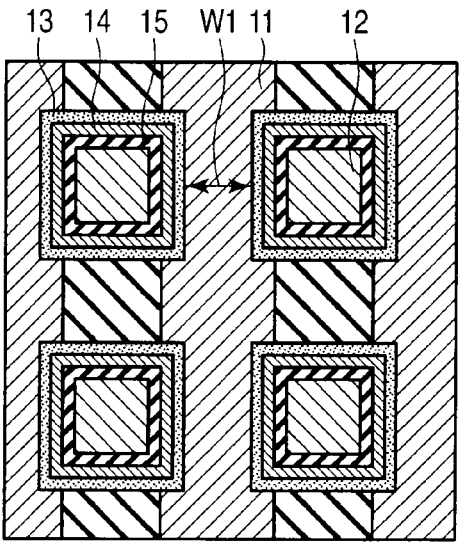
FIGS. 9A and 9B are cross-sectional views showing the array arrangement of the resistance-change memory cell array of the first embodiment.
Figure 9B:
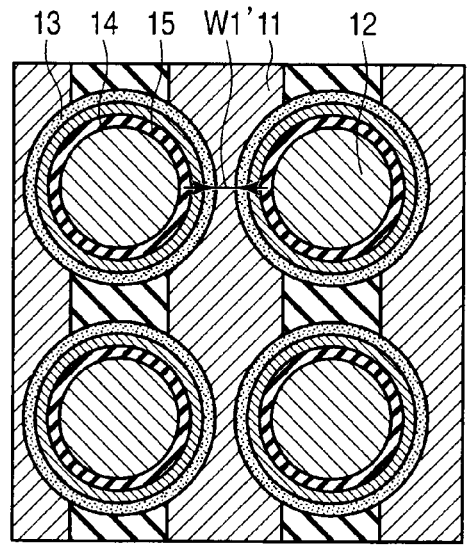
Figure 10A:
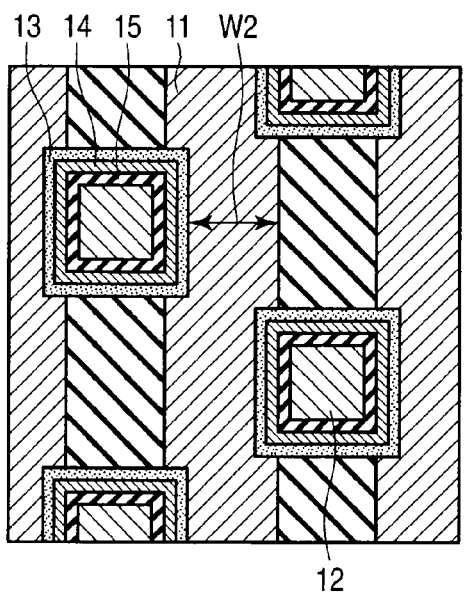
FIGS. 10A and 10B are cross-sectional views showing the array arrangement of the resistance-change memory cell array of the first embodiment.
Figure 10B:
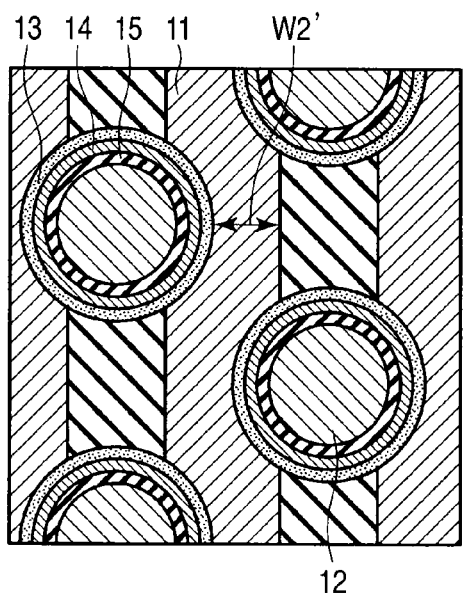

The view obtained by viewing the memory cell array of this embodiment from above is shown in FIGS. 9A and 9B. If the vertical electrodes 12 are arranged in a grid form as shown in FIGS. 9A and 9B, the minimum width W1 (or W1') of the horizontal electrode 11 adjacent to the memory cell is narrowed to increase the resistance and the rate of occurrence of erroneous operations is increased as the integration density is enhanced. In order to avoid this, it is preferable to alternately arrange the vertical electrodes 12 as shown in FIGS. 10A and 10B to enlarge the minimum width W2 (or W2') of the horizontal electrode 11 adjacent to the memory cell.

Second Embodiment

Figure 11A:
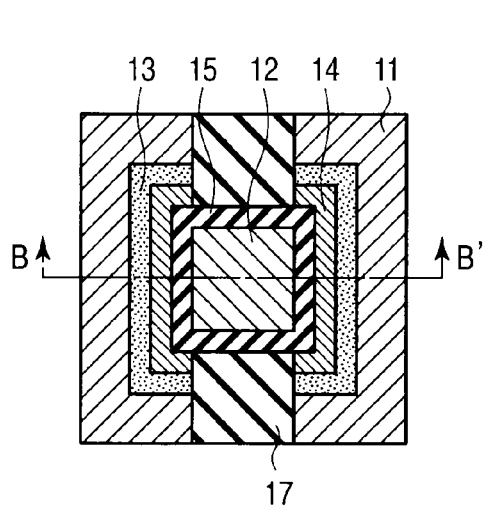
FIGS. 11A and 11B are cross-sectional views showing the structure of a 2-cell portion of a resistance-change memory cell array according to a second embodiment.
Figure 11B:
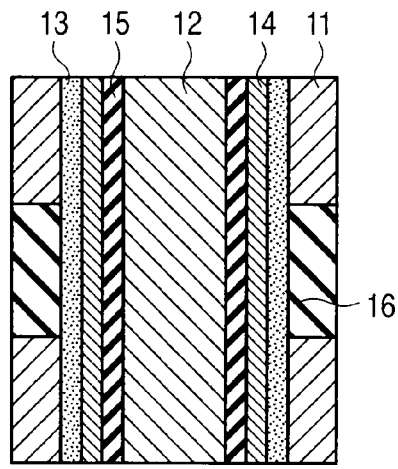

FIGS. 11A and 11B are sectional views showing the structure of a 2-cell portion of a resistance-change memory cell array according to a second embodiment. FIG. 11A is a horizontal sectional view and FIG. 11B is a vertical sectional view taken along line B-B' of FIG. 11A.

The present embodiment is different from the first embodiment explained before in that a conductive layer 14 formed on the sidewall portion of a vertical electrode 12 is divided by a region between horizontal electrodes 11 adjacent in the horizontal direction. That is, the conductive layer 14 and variable resistance film 13 are divided by insulating films 17 in the structure (FIG. 5A) of the first embodiment.

With the above structure, the same effect as that of the first embodiment can of course be attained and the following effect can also be attained. That is, since the conductive layer 14 is divided in the horizontal direction by the insulating films 17, shorting failure between the horizontal electrodes 11 adjacent in the horizontal direction can be avoided, a leakage current can be suppressed and the power consumption can be reduced.

Figure 12A:
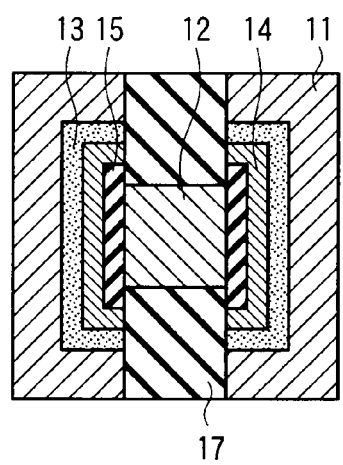
FIGS. 12A, 12B and 12C are cross-sectional views showing modifications of the resistance-change memory cell array of the second embodiment.
Figure 12B:
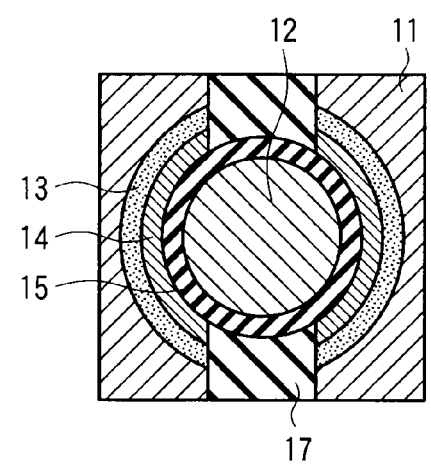
Figure 12C:
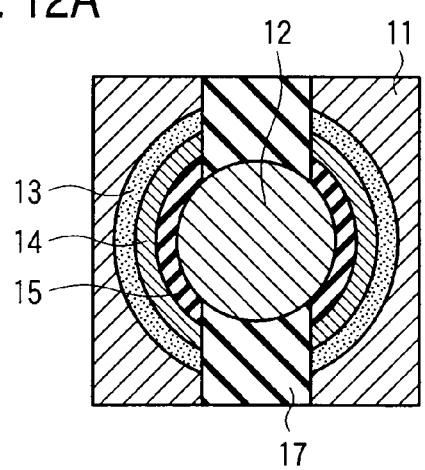

FIGS. 12A to 12C are cross-sectional views showing modifications of the second embodiment. In FIG. 12A, a variable resistance film 13, conductive layer 14 and rectifying insulating film 15 are divided in the structure (FIG. 5A) of the first embodiment. In FIG. 12B, a variable resistance film 13 and conductive layer 14 are divided in the structure (FIG. 6B) of the first embodiment. In FIG. 12C, a variable resistance film 13, conductive layer 14 and rectifying insulating film 15 are divided in the structure (FIG. 6B) of the first embodiment.

Third Embodiment

FIGS. 13A and 13B are cross-sectional views showing the structure of a 2-cell portion of a resistance-change memory cell array according to a third embodiment. FIG. 13A is a cross-sectional view in the horizontal direction and FIG. 13B is a cross-sectional view (cross-sectional view in the vertical direction) taken along line B-B' of FIG. 13A.

The present embodiment is different from the second embodiment explained before in the lamination order of laminated films formed on the side surface portion of a vertical electrode 12 and a variable resistance film 13, conductive layer 14 and rectifying insulating film 15 are formed from the inside portion. Then, the conductive layer 14 and rectifying insulating film 15 are divided by insulating films 17. That is, the conductive layer 14 and rectifying insulating film 15 are divided in the structure obtained by reversing the lamination order of the laminated films in the structure (FIG. 5A) of the first embodiment.

With the above structure, the area of the variable resistance film 13 is smaller than the area of the rectifying insulating film 15 in the facing region between the electrodes 11 and 12. Therefore, since an electric field applied to the variable resistance film 13 increases when a voltage is applied between the electrodes 11 and 12, the switching operation voltage of the memory cell can be reduced. Further, since an electric field applied to the rectifying insulating film 15 is reduced, a leakage current in an unselected cell is suppressed and the power consumption can be reduced. Additionally, since the conductive layer 14 is divided in the horizontal direction by the insulating films 17 like the second embodiment, shorting failure between the horizontal electrodes 11 adjacent in the horizontal direction can be avoided, a leakage current can be suppressed and the power consumption can be reduced.

Further, since a relatively high switching operation voltage (for example, 5 to 10 V) is required when a phase-change material such as a carbon film is used as the variable resistance film 13, the present cell structure in which an electric field applied to the variable resistance film 13 increases is suitably used.

FIGS. 14A to 14C are cross-sectional views showing modifications of the third embodiment. In FIG. 14A, a variable resistance film 13, conductive layer 14 and rectifying insulating film 15 are divided by insulating films 17 in the structure obtained by reversing the lamination order of the laminated films in the structure (FIG. 5A) of the first embodiment. In FIG. 14B, a conductive layer 14 and rectifying insulating film 15 are divided by insulating films 17 in the structure obtained by reversing the lamination order of the laminated films in the structure (FIG. 6B) of the first embodiment. In FIG. 14C, a variable resistance film 13, conductive layer 14 and rectifying insulating film 15 are divided by insulating films 17 in the structure obtained by reversing the lamination order of the laminated films in the structure (FIG. 6B) of the first embodiment.

In this case, a problem occurring when the conductive layer 14 is not divided is explained with reference to FIG. 15A. The horizontal electrodes 11 adjacent in the horizontal direction are electrically isolated by means of two portions of the rectifying insulating film 15. However, if the rectifying insulating film 15 is locally made thin, a current path indicated by an arrow is formed and shorting failure occurs. Further, even if local shorting failure does not occur, the total sum of infinitesimal currents flowing through the current path indicated by the arrow cannot be neglected as the integration density increases. This increases the power consumption.

On the other hand, according to this embodiment, since the conductive layer 14 is divided in the horizontal direction by the insulating films 17, shorting failure between the horizontal electrodes 11 adjacent in the horizontal direction can be avoided, a leakage current can be suppressed and the power consumption can be reduced.

Next, a manufacturing method of the memory cell array of this embodiment is explained with reference to FIGS. 16A to 16C. The manufacturing method can be similarly applied to the second embodiment if the lamination order of the laminated films is reversed.

First, as shown in FIG. 16A, conductive layers 11' formed of tungsten silicide or the like with a thickness of approximately 30 nm and insulating films 16' formed of silicon oxide films or the like with a thickness of approximately 30 nm are laminated in a multi-layered form on a substrate (not shown) having preset peripheral circuits formed thereon by use of the deposition technique such as the CVD method. Then, a hole having a rectangular cross-sectional shape in which the length of one side is approximately 40 nm is formed to penetrate the multi-layered structure by use of the anisotropic etching technique such as the RIE method. Subsequently, a rectifying insulating film 15 formed of alumina or the like with a thickness of approximately 5 nm and a conductive layer 14 formed of titanium nitride or the like with a thickness of approximately 5 nm are formed on the inner wall of the hole by use of the film formation technique such as the ALD method, CVD method or plating method. Further, a dummy burying film 30 formed of silicon nitride or the like is filled in a cavity formed in the central portion of the hole.

Next, as shown in FIG. 16B, a groove with a width of approximately 10 nm that divides the multi-layered structure, rectifying insulating film 15, conductive layer 14 and dummy buried film 30 is formed by use of an anisotropic etching technique such as the RIE method and then the dummy burying film 30 is removed by a chemical etching process. After this, an insulating film 17' formed of a silicon oxide film or the like is filled in the groove by use of a coating method or the like. Thus, horizontal electrodes 11 and interelectrode insulating films 16 are formed and the shape of the divided conductive layers 14 is determined.

Then, as shown in FIG. 16C, a hole having a rectangular cross-sectional shape in which the length of one side is approximately 20 nm is formed in a preset area of the insulating film 17' by use of the RIE method or the like. As a result, interelectrode insulating films 17 are formed. Subsequently, a variable resistance film 13 formed of nickel oxide or the like with a thickness of approximately 5 nm is formed on the inner wall of the hole by use of the film formation technique such as the ALD method, CVD method or plating method. Further, a vertical electrode 12 formed of a conductor of tungsten or the like is filled in a cavity formed in the central portion of the hole. As a result, a memory cell array is completed.

Next, a modification of the manufacturing method of the memory cell array of this embodiment is explained with reference to FIGS. 17A to 17C.

Figure 17A:
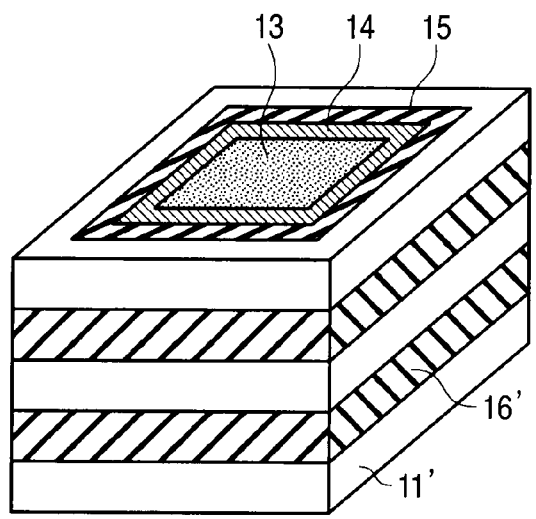
FIGS. 17A, 17B and 17C are bird's-eye views showing a modification of the manufacturing process of the resistance-change memory cell array of the third embodiment.

First, as shown in FIG. 17A, conductive layers 11' formed of tungsten silicide or the like with a thickness of approximately 30 nm and insulating films 16' formed of silicon oxide films or the like with a thickness of approximately 30 nm are laminated in a multi-layered form on a substrate (not shown) having preset peripheral circuits formed thereon by use of the deposition technique such as the CVD method. Then, a hole having a rectangular cross-sectional shape in which the length of one side is approximately 40 nm is formed to penetrate the multi-layered structure by use of the anisotropic etching technique such as the RIE method. Subsequently, a rectifying insulating film 15 formed of alumina or the like with a thickness of approximately 5 nm and a conductive layer 14 formed of titanium nitride or the like with a thickness of approximately 5 nm are formed on the inner wall of the hole by use of the film formation technique such as the ALD method, CVD method or plating method. Further, a variable resistance film 13 formed of nickel oxide or the like is filled in a cavity formed in the central portion of the hole.

Figure 17B:
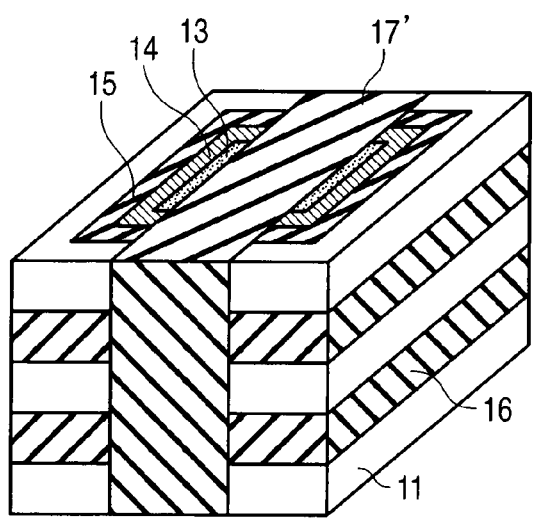

Next, as shown in FIG. 17B, a groove with a width of approximately 10 nm that divides the multi-layered structure, rectifying insulating film 15, conductive layer 14 and variable resistance film 13 is formed by use of an anisotropic etching technique such as the RIE method and then an insulating film 17' formed of a silicon oxide film or the like is filled in the groove by use of a coating method or the like. Thus, horizontal electrodes 11 and interelectrode insulating films 16 are formed and the shape of the divided conductive layers 14 is determined.

Figure 17C:
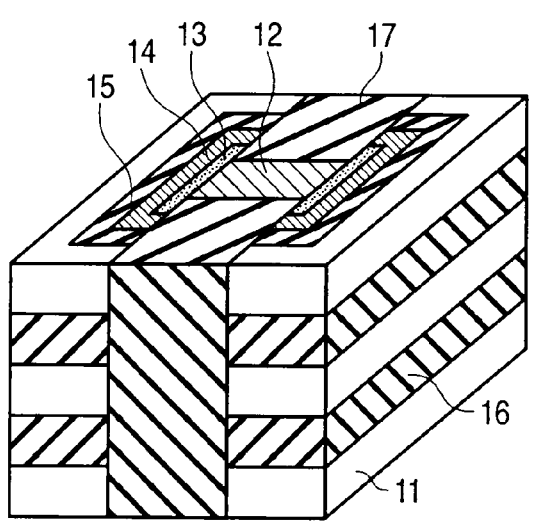

Then, as shown in FIG. 17C, a hole having a rectangular cross-sectional shape in which the length of one side is approximately 10 nm is formed in a preset area of the insulating film 17' by use of the RIE method or the like. As a result, interelectrode insulating films 17 are formed. Subsequently, a vertical electrode 12 formed of a conductor of tungsten or the like is filled in the hole by use of the film formation technique such as the ALD method, CVD method or plating method. As a result, a memory cell array is completed.

Fourth Embodiment

FIGS. 18A to 18D and FIGS. 19A to 19D are cross-sectional views showing the structure of a 2-cell portion of a resistance-change memory cell array according to a fourth embodiment. FIGS. 18A to 18D are horizontal sectional views and FIGS. 19A to 19D are vertical sectional views.

The present embodiment is different from the first to third embodiments in that a conductive layer 14 formed on the sidewall portion of a vertical electrode 12 is divided by an insulating film 16 in an region between horizontal electrodes 11 adjacent vertically. The conductive layer 14 and rectifying insulating film 15 may be divided as shown in FIG. 19A or a variable resistance film 13 and conductive layer 14 may be divided as shown in FIG. 19B. Further, all of the variable resistance film 13, conductive layer 14 and rectifying insulating film 15 may be divided as shown in FIGS. 19C and 19D.

A problem occurring when the conductive layer 14 is not divided is explained with reference to FIG. 15A. The horizontal electrodes 11 adjacent in the vertical direction are electrically isolated by means of two portions of the rectifying insulating film 15. However, if the rectifying insulating film 15 is locally made thin, a current path indicated by an arrow is formed and shorting failure occurs. Further, even if local shorting failure does not occur, the total sum of infinitesimal currents flowing through the current path indicated by the arrow cannot be neglected as the integration density increases. This increases the power consumption.

On the other hand, according to this embodiment, since the conductive layer 14 is divided in the vertical direction by the insulating film 16, shorting failure between the horizontal electrodes 11 adjacent in the vertical direction can be avoided. Further, a leakage current can be suppressed and the power consumption can be reduced.

Next, a manufacturing method of the memory cell array of this embodiment is explained with reference to FIGS. 20A to 20E. FIGS. 20A to 20E are cross-sectional views showing a 2-cell portion in the vertical direction. In this case, an example of the structure of FIGS. 18A and 19A is explained, but another structure can be substantially similarly formed.

Figure 20A:
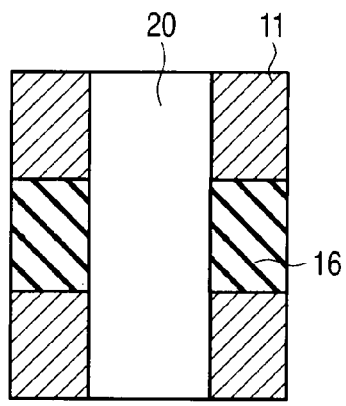
FIGS. 20A, 20B, 20C, 20D and 20E are cross-sectional views showing a manufacturing process of the resistance-change memory cell array of the fourth embodiment.

First, like the process of FIGS. 7A to 7C, conductive layers 11' and insulating layers 16' are laminated in a multi-layered form, then a groove with a width of approximately 30 nm that divides the multi-layered structure is formed and an insulating film 17' is filled in the groove. As a result, horizontal electrodes 11 and interelectrode insulating films 16 are formed. Further, a hole 20 having a rectangular cross-sectional shape in which the length of one side is approximately 30 nm is formed in the area of the insulating film 17'. As a result, interelectrode insulating films 17 are formed. The cross section in the vertical direction in this state is shown in FIG. 20A.

Figure 20B:
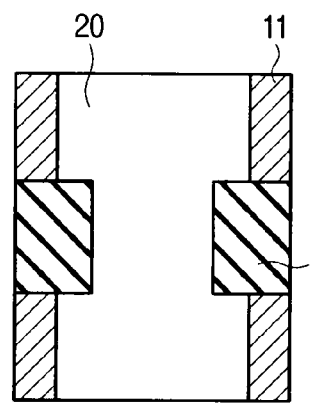

Next, as shown in FIG. 20B, the horizontal electrode 11 that is exposed to the hole 20 is retreated by approximately 10 nm at one time.

Figure 20C:
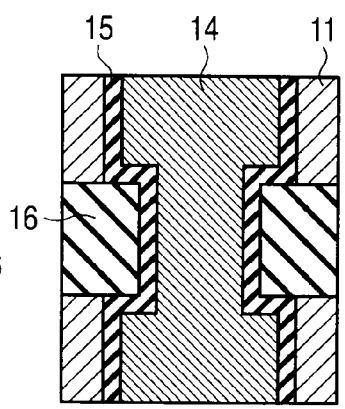

Then, as shown in FIG. 20C, a rectifying insulating film 15 formed of alumina or the like with a thickness of approximately 5 nm is formed on the inner wall of the hole 20 by use of the film formation technique such as the ALD method, CVD method or plating method. Further, a conductive layer 14 formed of doped silicon or the like is filled in a cavity formed in the central portion of the hole.

Figure 20D:
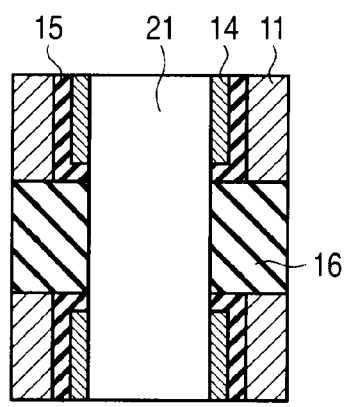

Subsequently, as shown in FIG. 20D, a cavity 21 having a rectangular cross-sectional shape in which the length of one side is approximately 30 nm is formed in the area of the conductive layer 14 by use of the anisotropic etching technique such as the RIE method. At this time, the conductive layer 14 is divided in the vertical direction by performing an etching process to expose interelectrode insulating films 16.

Figure 20E:
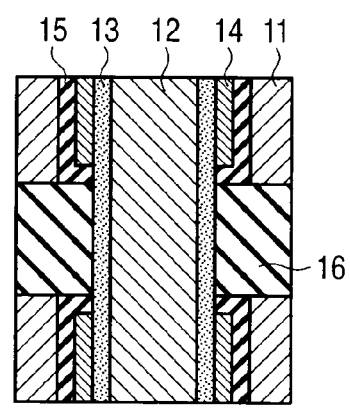

Next, as shown in FIG. 20E, a variable resistance film 13 formed of nickel oxide or the like with a thickness of approximately 5 nm is formed on the inner wall of the hole by use of the film formation technique such as the ALD method, CVD method or plating method. Further, a vertical electrode 12 formed of a conductor of tungsten or the like is filled in a cavity formed in the central portion of the hole and thus a memory cell array is completed.

A modification of the manufacturing method of the resistance-change memory cell array of the present embodiment is explained with reference to FIGS. 21A to 21E. FIGS. 21A to 21E are cross-sectional views showing a 2-cell portion in the vertical direction like the case of FIGS. 20A to 20E. In this case, an example of the structure of FIGS. 18C and 19C is explained.

The process up to the step of FIGS. 21A and 21B is the same as that of FIGS. 20A and 20B. However, the retreat amount of the horizontal electrode 11 that is exposed to the hole 20 is set larger than 10 nm and, for example, 15 nm.

Then, as shown in FIG. 21C, a rectifying insulating film 15 formed of alumina or the like with a thickness of approximately 5 nm and a conductive layer 14 formed of titanium nitride or the like with a thickness of approximately 5 nm are formed on the inner wall of the hole 20 by use of the film formation technique such as the ALD method, CVD method or plating method. Further, a variable resistance film 13 formed of nickel oxide or the like is filled in a cavity formed in the central portion of the hole.

Next, as shown in FIG. 21D, a cavity 21 having a rectangular cross-sectional shape in which the length of one side is approximately 20 nm is formed in the area of the variable resistance film 13 by use of the anisotropic etching technique such as the RIE method. At this time, the conductive layer 14 is divided in the vertical direction by performing an etching process to expose interelectrode insulating films 16.

Next, as shown in FIG. 21E, a memory cell array is completed by filling the vertical electrode 12 formed of a conductor of tungsten or the like in the cavity 21 formed in the central portion of the hole 20 by use of the film formation technique such as the ALD method, CVD method or plating method.

Fifth Embodiment

This embodiment shows another manufacturing method that realizes the cell array structure of the third and fourth embodiments.

FIGS. 22A and 22B are schematic views for illustrating a method (horizontal division) for electrically dividing a conductive layer 14 formed on the sidewall portion of a vertical electrode 12 in an region between horizontal electrodes 11 adjacent horizontally.

First, the horizontal electrodes 11 and vertical electrodes 12 are arranged in a 3-dimensional cross-point structure by use of the same process as that of FIGS. 7A to 7D, a variable resistance film 13, conductive layer 14 and rectifying insulating film 15 are formed on the sidewall portion of the vertical electrode 12 and the structure having interelectrode insulating films 16, 17 formed in a horizontal interelectrode region and vertical interelectrode region is formed. At this time, as the interelectrode insulating films 17, a hygroscopic insulating film 27 formed of tetraethoxysilane or the like instead of the silicon oxide film is used. The cross section obtained in the horizontal direction at this time is shown in FIG. 22A.

Next, as shown in FIG. 22B, moisture is contained in the hygroscopic insulating film 27 by supplying water vapor thereto and then water is eliminated by heating the same to approximately 400° C. or higher. The thus eliminated water passes through the rectifying insulating film 27 to selectively oxidize a portion 40 of the conductive layer 14 that lies near the insulating film 27. As a result, the conductive layer 14 is electrically divided in an region between the horizontal electrodes 11 adjacent in the horizontal direction. In this embodiment, the conductive layer 14 is formed of doped silicon, but any material whose conductivity is lost by oxidation can be used and, for example, titanium nitride can be used.

FIGS. 23A and 23B show a modification of the above embodiment and the same effect can be attained even when the variable resistance film 13 is provided outside. Further, this embodiment can of course be applied to a cell cross-sectional shape as shown in the drawing.

Figure 24A:
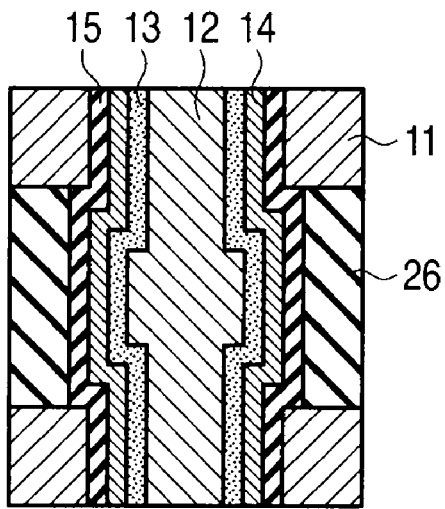
FIGS. 24A and 24B are cross-sectional views showing a manufacturing process (vertical division) of the resistance-change memory cell array according to the fifth embodiment.
Figure 24B:
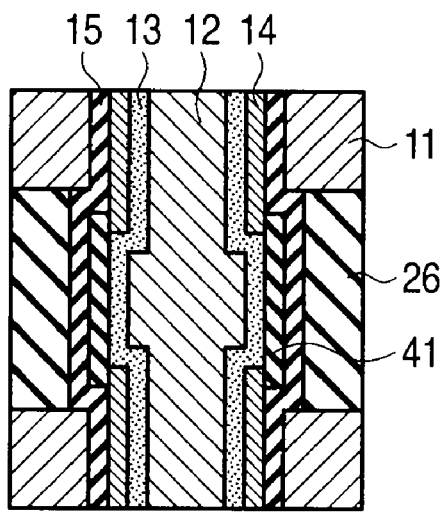

Further, FIGS. 24A and 24B are schematic views for illustrating a method for dividing a conductive layer 14 formed on the sidewall portion of a vertical electrode 12 in a region between horizontal electrodes 11 adjacent vertically.

First, as shown in FIG. 24A, a hygroscopic insulating film 26 formed of tetraethoxysilane or the like is used as an interelectrode insulating film 16 between horizontal electrodes. Then, as shown in FIG. 24B, a portion 41 of the conductive layer 14 that lies near the insulating film 26 is selectively oxidized. As a result, the conductive layer 14 is electrically divided in a region between the horizontal electrodes 11 adjacent in the horizontal direction.

Figure 25A:
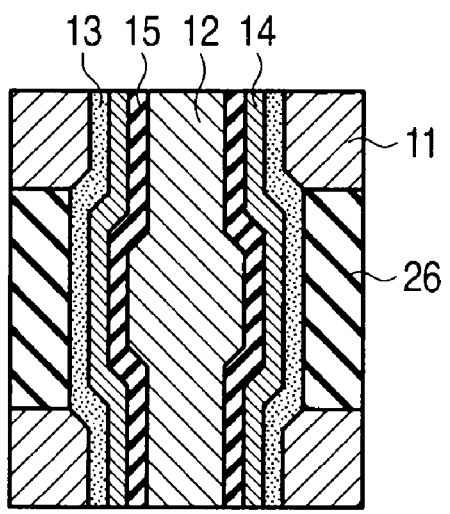
FIGS. 25A and 25B are cross-sectional views showing another manufacturing process (vertical division) of the resistance-change memory cell array of the fifth embodiment.
Figure 25B:
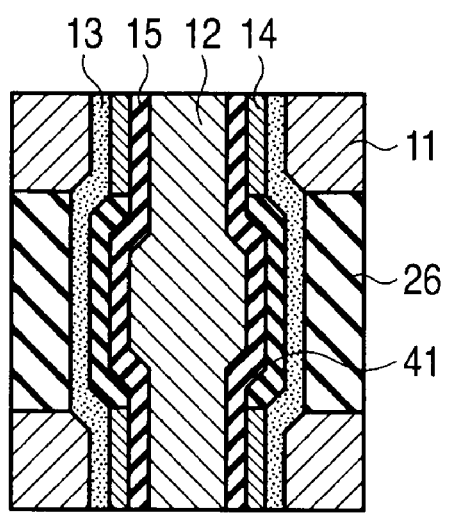

FIGS. 25A and 25B show a modification of the above embodiment and the same effect can be attained even when the variable resistance film 13 is provided outside. Further, this embodiment can of course be applied to a cell cross-sectional shape as shown in the drawing.

Sixth Embodiment

FIGS. 26A to 26D show the structures of a resistance-change memory cell array according to a sixth embodiment. FIGS. 26A to 26D are horizontal sectional views showing one memory cell portion.

Figure 26A:
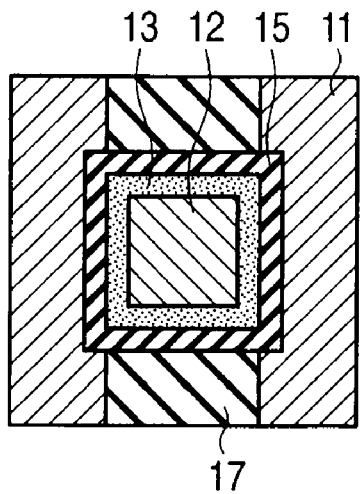
FIGS. 26A, 26B, 26C and 26D are cross-sectional views showing the structure of a 2-cell portion of a resistance-change memory cell array according to a sixth embodiment.
Figure 26B:
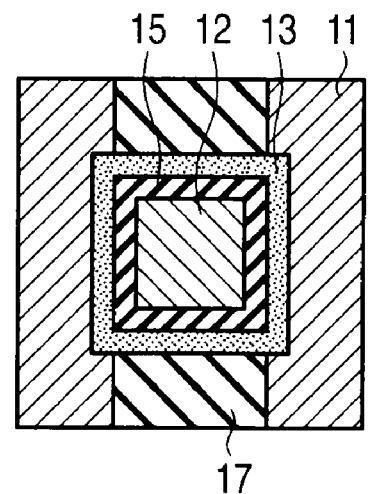
Figure 26C:
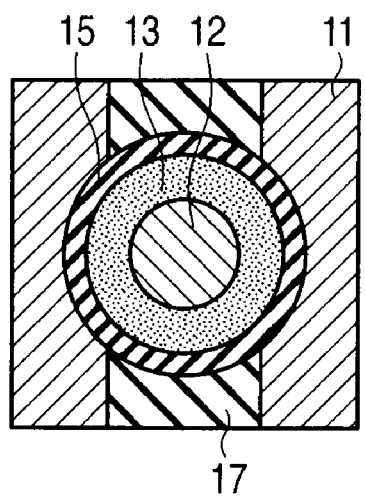
Figure 26D:
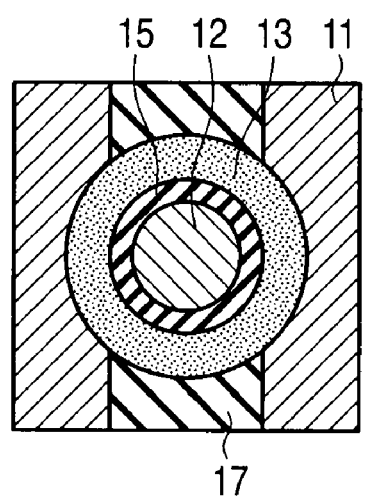

The present embodiment is different from the first to fifth embodiments in that the conductive layer 14 formed between the variable resistance film 13 and the rectifying insulating film 15 is omitted. FIGS. 26A and 26B show a case wherein the cross-sectional shape of a vertical electrode 12 is rectangular and FIGS. 26C and 26D show a case wherein the cross-sectional shape of the vertical electrode 12 is circular. Further, FIGS. 26A and 26C show a case wherein the outermost portion of the laminated films is the rectifying insulating film 15 and FIGS. 26B and 26D show a case wherein the outermost portion of the laminated films is the variable resistance film 13.

Figure 15A:
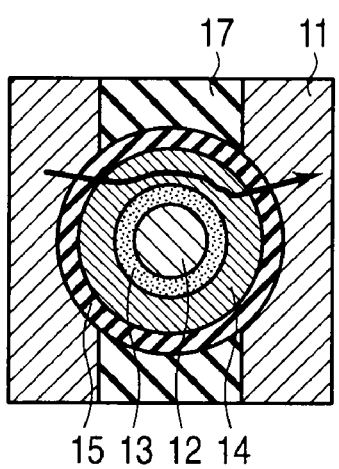
FIGS. 15A and 15B are schematic views for illustrating a problem caused when a conductive layer is not divided.
Figure 15B:
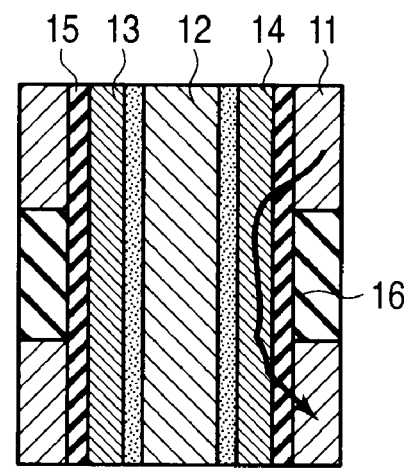

With the above structures, a leakage current between the adjacent horizontal electrodes (or adjacent vertical electrodes) as shown in FIGS. 15A and 15B can be greatly suppressed and the power consumption of the highly integrated memory cell array can be reduced. However, since the effect of suppressing the leakage current of an unselected memory cell is reduced if the conductive layer 14 is omitted, the application voltage at the memory cell operation time is limited. Further, the combination of materials of the variable resistance film 13 and rectifying insulating film 15 is limited. Therefore, it is preferable to use a material that can supply a sufficiently large current to a selected cell as the rectifying insulating film 15. For example, a silicon oxide or a silicon oxynitride is preferable, which has large band gap energy and a low dielectric constant.

Figure 27A:
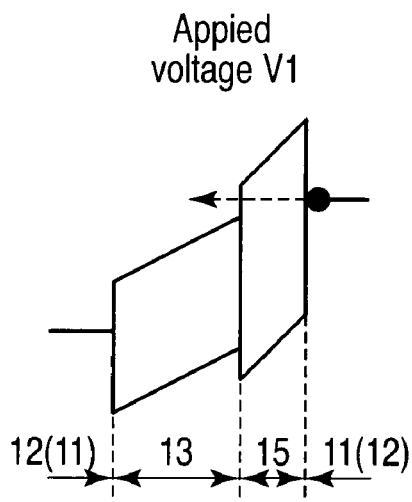
FIGS. 27A, 27B, 27C and 27D are energy band diagrams for illustrating the action of a rectifying insulating film in the sixth embodiment.
Figure 27B:
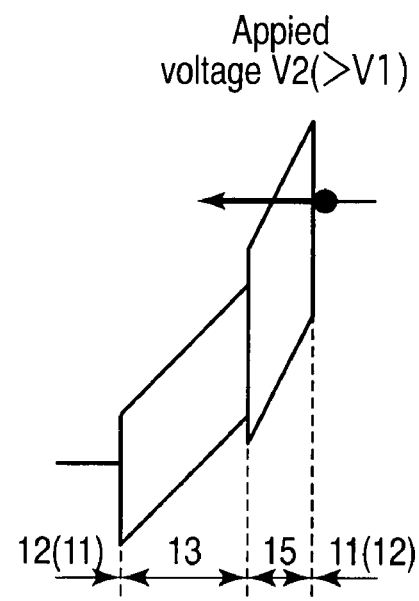
Figure 27C:
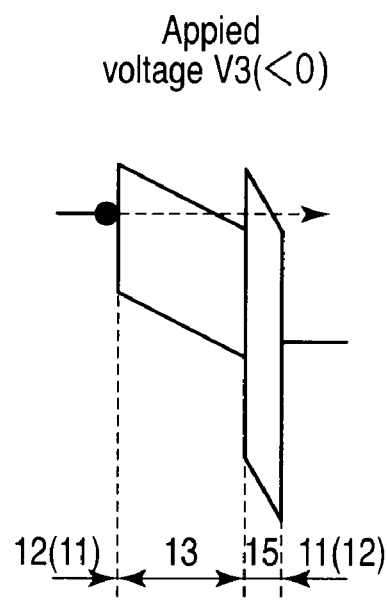
Figure 27D:
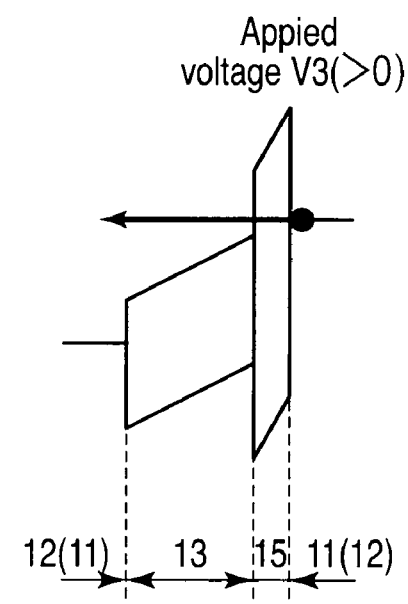

The rectifying action in the memory cell of the present embodiment is explained with reference to the energy band diagrams of FIGS. 27A to 27D. FIGS. 27A and 27B show a case wherein a passage current amount is changed by several digits by changing the magnitude of the application voltage. FIGS. 27C and 27D show a case wherein a passage current amount is changed by several digits by changing the polarity of the application voltage. A significant rectifying effect can be attained by selecting a material to increase a difference between the dielectric constants of the variable resistance film 13 and rectifying insulating film 15.

Modification

This invention is not limited to the above embodiments. In the above embodiments, the variable resistance film and rectifying insulating film are formed to cover the peripheral side surface of the vertical electrode, but the structure is not limited to this case. For example, the variable resistance film and rectifying insulating film may be formed in a facing region between the horizontal electrode and the vertical electrode. Further, the cross-sectional shape of the vertical electrode is not limited to a circle or rectangle, but may be an ellipse. Likewise, the cross-sectional shape of the horizontal electrode is not limited to a rectangle, but may be a circle or ellipse. Further, the conditions of materials and film thicknesses of the respective portions can be adequately changed according to the specification.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance-change memory cell array in which a plurality of horizontal electrodes extending horizontally and a plurality of vertical electrodes extending vertically are arranged to configure a cross-point structure, comprising:
    rectifying insulating films formed in contact with side surfaces of the vertical electrodes in respective facing regions between the horizontal electrodes and the vertical electrodes,
    variable resistance films formed in contact with side surfaces of the horizontal electrodes in the facing regions between the horizontal electrodes and the vertical electrodes, and
    conductive layers formed between the rectifying insulating films and the variable resistance films.

2. The memory cell array according to claim 1, wherein an area of the rectifying insulating film in a direction perpendicular to a facing direction of the horizontal electrodes and the vertical electrodes is smaller than an area of the variable resistance film in a direction perpendicular to the facing direction.

3. The memory cell array according to claim 1, wherein the rectifying insulating film is formed to cover a peripheral side surface of the vertical electrode, the conductive layer is formed to cover a peripheral side surface of the rectifying insulating film and the variable resistance film is formed to cover a peripheral side surface of the conductive layer and has a portion formed in contact with the side surface of the horizontal electrode.

4. The memory cell array according to claim 3, wherein the conductive layer is divided in a region between the horizontal electrodes adjacent in the horizontal direction.

5. The memory cell array according to claim 3, wherein the conductive layer is divided in a region between the vertical electrodes adjacent in the vertical direction.

6. The memory cell array according to claim 1, wherein a concave portion containing an area that faces the vertical electrode and is larger than the area is formed in a surface portion of the horizontal electrode that faces the vertical electrode.

7. The memory cell array according to claim 1, wherein the side surface of the horizontal electrode is a concave curved surface and the side surface of the vertical electrode is a convex curved surface in the facing region between the horizontal electrodes and the vertical electrodes.

8. The memory cell array according to claim 1, wherein respective adjacent arrays of the vertical electrodes along an extending direction of the horizontal electrode are shifted by a half pitch.

9. A resistance-change memory cell array in which a plurality of horizontal electrodes extending horizontally and a plurality of vertical electrodes extending vertically are arranged to configure a cross-point structure, comprising:
    variable resistance films formed in contact with side surfaces of the vertical electrodes in respective facing regions between the horizontal electrodes and the vertical electrodes,
    rectifying insulating films formed in contact with side surfaces of the horizontal electrodes in the facing regions between the horizontal electrodes and the vertical electrodes, and
    conductive layers formed between the variable resistance films and the rectifying insulating films.

10. The memory cell array according to claim 9, wherein an area of the variable resistance film in a direction perpendicular to a facing direction of the horizontal electrodes and the vertical electrodes is smaller than an area of the rectifying insulating film in a direction perpendicular to the facing direction.

11. The memory cell array according to claim 9, wherein the variable resistance film is formed to cover a peripheral side surface of the vertical electrode, the conductive layer is formed to cover a peripheral side surface of the variable resistance film and the rectifying insulating film is formed to cover a peripheral side surface of the conductive layer and has a portion formed in contact with the side surface of the horizontal electrode.

12. The memory cell array according to claim 11, wherein the conductive layer is divided in a region between the horizontal electrodes adjacent in the horizontal direction.

13. The memory cell array according to claim 11, wherein the conductive layer is divided in a region between the vertical electrodes adjacent in the vertical direction.

14. The memory cell array according to claim 9, wherein a concave portion containing an area that faces the vertical electrode and is larger than the area is formed in a surface portion of the horizontal electrode that faces the vertical electrode.

15. The memory cell array according to claim 9, wherein a side surface of the horizontal electrode is a concave curved surface and a side surface of the vertical electrode is a convex curved surface in the facing region between the horizontal electrodes and the vertical electrodes.

16. The memory cell array according to claim 9, wherein respective adjacent arrays of the vertical electrodes formed along an extending direction of the horizontal electrode are shifted by a half pitch.

17. A resistance-change memory cell array in which a plurality of horizontal electrodes extending horizontally and a plurality of vertical electrodes extending vertically are arranged to configure a cross-point structure, comprising:
    rectifying insulating films formed in contact with side surfaces of one of the horizontal electrodes and vertical electrodes in facing regions between the respective electrodes, and
    variable resistance films formed in contact with side surfaces of the other electrodes of the horizontal electrodes and vertical electrodes in the facing regions between the respective electrodes and formed in contact with the rectifying insulating films, wherein an area of the rectifying insulating film in a direction perpendicular to a facing direction of the above electrodes is smaller than an area of the variable resistance film in a direction perpendicular to the facing direction.

18. The memory cell array according to claim 17, wherein the rectifying insulating film is formed to cover a peripheral side surface of the vertical electrode, and the variable resistance film is formed to cover a peripheral side surface of the rectifying insulating film and has a portion formed in contact with the side surface of the horizontal electrode.

19. The memory cell array according to claim 17, wherein a concave portion containing an area that faces the vertical electrode and is larger than the area is formed in a surface portion of the horizontal electrode that faces the vertical electrode.

20. The memory cell array according to claim 17, wherein a side surface of the horizontal electrode is a concave curved surface and a side surface of the vertical electrode is a convex curved surface in the facing region between the horizontal electrodes and the vertical electrodes.

* * * * *